US008021949B2

(12) United States Patent
Cheng et al.

(10) Patent No.: US 8,021,949 B2
(45) Date of Patent: Sep. 20, 2011

(54) METHOD AND STRUCTURE FOR FORMING FINFETS WITH MULTIPLE DOPING REGIONS ON A SAME CHIP

(75) Inventors: Kangguo Cheng, Albany, NY (US); Bruce B. Doris, Albany, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/628,663

(22) Filed: Dec. 1, 2009

(65) Prior Publication Data

US 2011/0129978 A1 Jun. 2, 2011

(51) Int. Cl.
*H01L 21/331* (2006.01)

(52) U.S. Cl. ........ 438/302; 438/156; 438/157; 438/268; 438/478; 257/220; 257/302; 257/328; 257/392

(58) Field of Classification Search .......... 438/156–157, 438/268, 478, 283, 173–176, 302; 257/220, 257/302, 328, 392, E27.081, E21.615, E21.375, 257/E21.629, E21.41, E21.439
See application file for complete search history.

(56) References Cited

U.S. PATENT DOCUMENTS

| | | | | | |
|---|---|---|---|---|---|
| 5,949,105 | A | * | 9/1999 | Moslehi | 257/336 |
| 6,350,656 | B1 | * | 2/2002 | Lin et al. | 438/302 |
| 6,399,450 | B1 | | 6/2002 | Yu | |
| 6,403,434 | B1 | | 6/2002 | Yu | |
| 6,458,662 | B1 | * | 10/2002 | Yu | 438/286 |
| 6,472,282 | B1 | | 10/2002 | Yu | |
| 6,492,212 | B1 | * | 12/2002 | Ieong et al. | 438/157 |
| 6,521,502 | B1 | | 2/2003 | Yu | |
| 6,524,920 | B1 | | 2/2003 | Yu | |
| 6,716,690 | B1 | * | 4/2004 | Wang et al. | 438/197 |
| 6,756,277 | B1 | * | 6/2004 | Yu | 438/300 |
| 6,762,448 | B1 | * | 7/2004 | Lin et al. | 257/302 |
| 6,800,885 | B1 | * | 10/2004 | An et al. | 257/275 |
| 6,853,020 | B1 | * | 2/2005 | Yu et al. | 257/270 |
| 6,885,055 | B2 | * | 4/2005 | Lee | 257/308 |
| 6,909,147 | B2 | * | 6/2005 | Aller et al. | 257/347 |
| 6,919,647 | B2 | | 7/2005 | Hackler, Sr. et al. | |
| 7,015,547 | B2 | | 3/2006 | Hackler, Sr. et al. | |
| 7,019,342 | B2 | | 3/2006 | Hackler, Sr. et al. | |
| 7,074,623 | B2 | | 7/2006 | Lochtefeld et al. | |
| 7,074,656 | B2 | * | 7/2006 | Yeo et al. | 438/157 |
| 7,109,516 | B2 | | 9/2006 | Langdo et al. | |
| 7,176,067 | B2 | * | 2/2007 | Jung et al. | 438/144 |
| 7,176,483 | B2 | | 2/2007 | Grupp et al. | |
| 7,193,279 | B2 | * | 3/2007 | Doyle et al. | 257/401 |
| 7,265,417 | B2 | * | 9/2007 | Adkisson et al. | 257/347 |
| 7,298,007 | B1 | * | 11/2007 | Hill et al. | 257/335 |
| 7,420,230 | B2 | | 9/2008 | Tsuchiaki | 257/220 |
| 7,701,008 | B2 | * | 4/2010 | Yeo et al. | 257/347 |
| 7,791,140 | B2 | * | 9/2010 | Van Dal et al. | 257/347 |
| 7,800,152 | B2 | * | 9/2010 | Zhu et al. | 257/302 |

(Continued)

*Primary Examiner* — N Drew Richards
*Assistant Examiner* — Ankush K Singal
(74) *Attorney, Agent, or Firm* — Tutunjian & Bitetto, P.C.; Louis J. Percello

(57) ABSTRACT

A method for fabrication of features for an integrated circuit includes patterning a first semiconductor structure on a surface of a semiconductor device, and epitaxially growing semiconductor material on opposite sides of the first semiconductor structure to form fins. A first angled ion implantation is applied to one side of the first semiconductor structure to dope a respective fin on the one side. The first semiconductor structure is selectively removed to expose the fins. Fin field effect transistors are formed using the fins.

16 Claims, 9 Drawing Sheets

U.S. PATENT DOCUMENTS

| | | | |
|---|---|---|---|
| 2002/0086463 A1* | 7/2002 | Houston et al. | 438/148 |
| 2003/0113970 A1* | 6/2003 | Fried et al. | 438/286 |
| 2003/0151077 A1* | 8/2003 | Mathew et al. | 257/250 |
| 2004/0157353 A1* | 8/2004 | Ouyang et al. | 438/38 |
| 2004/0197951 A1* | 10/2004 | Leedy | 438/107 |
| 2004/0222466 A1* | 11/2004 | Fried et al. | 257/347 |
| 2004/0259315 A1* | 12/2004 | Sakaguchi et al. | 438/285 |
| 2005/0051825 A1* | 3/2005 | Fujiwara et al. | 257/308 |
| 2005/0057964 A1* | 3/2005 | Mathew et al. | 365/177 |
| 2005/0116218 A1* | 6/2005 | Yang | 257/19 |
| 2005/0272195 A1* | 12/2005 | Bryant et al. | 438/212 |
| 2005/0277211 A1* | 12/2005 | Mathew et al. | 438/21 |
| 2006/0166456 A1* | 7/2006 | Fujiwara et al. | 438/399 |
| 2006/0231918 A1 | 10/2006 | Popp et al. | |
| 2007/0099350 A1* | 5/2007 | Zhu | 438/142 |
| 2007/0126076 A1* | 6/2007 | Mathew et al. | 257/438 |
| 2007/0205421 A1* | 9/2007 | Mathew et al. | 257/80 |
| 2007/0218620 A1* | 9/2007 | Zhu et al. | 438/212 |
| 2008/0105897 A1* | 5/2008 | Zhu | 257/190 |
| 2008/0206934 A1* | 8/2008 | Jones et al. | 438/151 |
| 2008/0299719 A1* | 12/2008 | Tsuchiaki | 438/197 |
| 2009/0261423 A1* | 10/2009 | Sawada | 257/392 |
| 2009/0302402 A1* | 12/2009 | Anderson et al. | 257/411 |
| 2010/0044762 A1* | 2/2010 | Orlowski | 257/288 |

* cited by examiner

METHOD AND STRUCTURE FOR FORMING FINFETS WITH MULTIPLE DOPING REGIONS ON A SAME CHIP

BACKGROUND

1. Technical Field

The present invention relates to semiconductor fabrication and more particularly to a structure and methods for forming multiple doping regions for finFETs without a critical mask step or structure.

2. Description of the Related Art

Fin field effect transistors (finFETs) have been extensively investigated as one of the future device options for continued scaling of complementary metal oxide semiconductor (CMOS) technology. Most CMOS applications require various types of devices on the same chip. For example, a microprocessor chip usually includes both n-type and p-type (nFETs and pFETs) devices with various threshold voltages (Vt), e.g., high Vt, regular Vt, and low Vt. FinFETs with different Vt require different doping in the fin portions.

Prior art approaches for forming finFETs with different fin doping are complex and costly because they require multiple critical lithography steps for forming fins and masking some fins while doping other fins. Generally, these methods require masking one portion of a semiconductor wafer, performing a doping technique or other process, removing the mask, forming a new mask on another portion of the wafer followed by performing a different doping technique or other process and removing the new mask. The masking and doping processes have to be performed accurately to ensure proper operation of the devices. This incurs considerable time and cost.

SUMMARY

A method for fabrication of features for an integrated circuit includes patterning a first semiconductor structure on a surface of a semiconductor device, and epitaxially growing semiconductor material on opposite sides of the first semiconductor structure to form fins. A first angled ion implantation is applied to one side of the first semiconductor structure to dope a respective fin on the one side. The first semiconductor structure is selectively removed to expose the fins. Fin field effect transistors are formed using the fins.

A method for fabrication of features for an integrated circuit includes patterning mandrels on a surface of a semiconductor substrate; forming spacers about a periphery of the mandrels; applying a first angled ion implantation to introduce a first doping such that the spacers and mandrels form a blocking mask to direct the first doping into an underlying semiconductor layer on one side of the blocking mask; applying a second angled ion implantation in an opposite direction to the first angled ion implantation to introduce a second doping such that the blocking mask directs the second doping into the underlying semiconductor layer on an opposite side of the blocking mask; selectively removing the mandrels relative to the spacers; patterning the underlying semiconductor layer using the spacers as an etch mask to form fins with the first doping and fins with second doping; annealing the fins with the first doping and fins with second doping; and forming fin field effect transistors using the fins.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
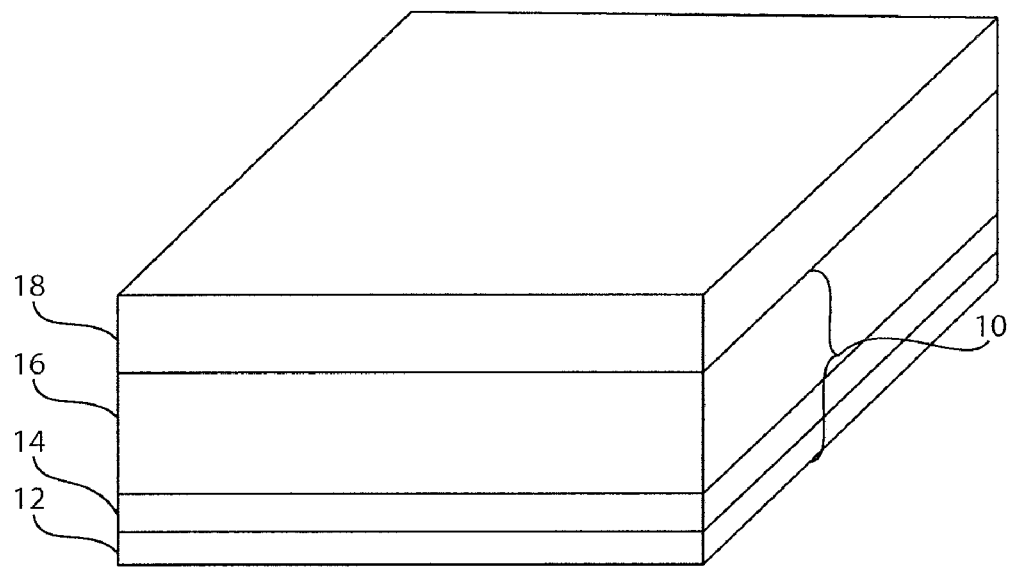
FIG. 1 is a perspective view of a semiconductor-on-insulator substrate having a pad layer formed thereon.

In accordance with the present principles, a method and structure for forming finFETs with different fin doping on a same chip is provided. In one illustrative embodiment, fins are formed on sidewalls of a sacrificial mandrel (e.g., porous silicon or SiGe) by epitaxial growth. Fins on a first side of the sacrificial mandrel are doped by a first angled ion implantation and fins on a second side of the sacrificial mandrel are doped differently by a second ion implantation. In another embodiment, fins on a first side of the sacrificial mandrel are doped by a first angled ion implantation, and fins on a second side of the sacrificial mandrel remain undoped. The first fin and the second fin are doped differently to form two or more different devices based on polarity, threshold voltage or both.

It is to be understood that the present invention will be described in terms of a given illustrative architecture; however, other architectures, structures, substrate materials and process features and steps may be varied within the scope of the present invention.

The structures and process steps are preferably part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a semiconductor-on-insulator substrate (SOI) 10 is shown having a cap or pad layer or dielectric liner 18 formed thereon. The SOI substrate 10 may include a silicon base layer 12 with an insulating layer (e.g., a buried oxide (BOX) layer) 14 and a silicon on oxide layer 16. It should be understood that the substrate 10 may include any suitable material and is not limited to SOI. For example, substrate 10 can be an SOI or bulk substrate that may include gallium arsenide, monocrystalline silicon, germanium, or any other material or combination of materials where the present principles may be applied. In some embodiments, the substrate 10 further comprises other features or structures that are formed on or in the semiconductor substrate in previous process steps.

Dielectric liner 18 may include a dielectric material that enables selective etching of underlying materials (e.g., layer 16). In one embodiment, layer 16 is monocrystalline silicon and liner 18 may include silicon nitride (nitride) or silicon oxide (oxide). Liner 18 is deposited or thermally grown on layer 16.

Figure 2:
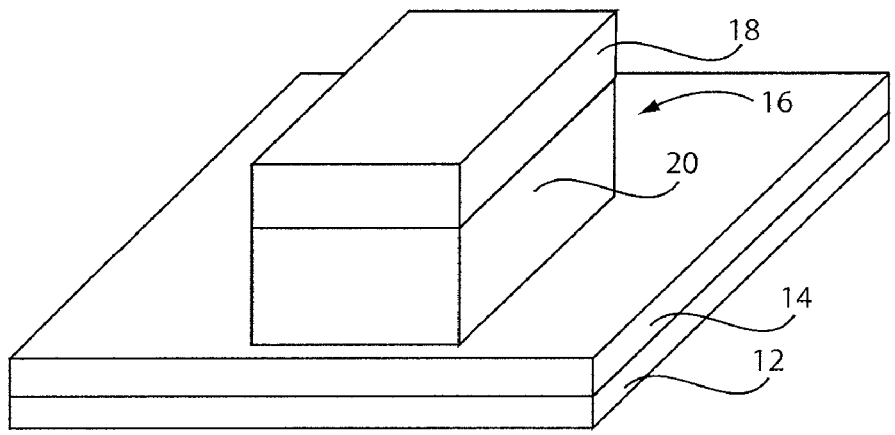
FIG. 2 is a perspective view of the device in FIG. 1 showing the pad layer and a semiconductor layer patterned.

Referring to FIG. 2, liner 18 is patterned by, e.g., a lithographic patterning process. Once the liner 18 is patterned, an etch process, such as, e.g., a reactive ion etch may be employed to remove a portion of layer 16. Liner 18 may act as an etch mask to open up layer 16. The patterning of liner 18 may include patterning an underlying layer such as layer 16 at the same time. Alternately, liner 18 may be patterned and then employed as a mask to etch material of layer 16. Layer 16 in this example includes silicon. Layer 16 forms a mandrel 20.

Figure 3:
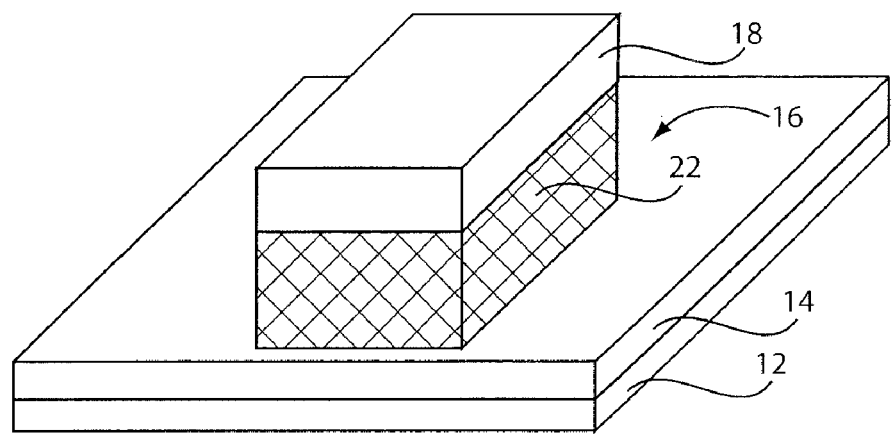
FIG. 3 is a perspective view of the device in FIG. 2 showing the semiconductor layer converted by a treatment process.

Referring to FIG. 3, the mandrel 20 is converted to a seed material 22 to promote epitaxial growth on sidewalls of the mandrel 20, for example, mandrel 20 is converted to a porous silicon by a known process (e.g., doping followed by anodization). It should be understood that the mandrel 20 may be formed using other methods as well. For example, a polysilicon mandrel may be formed on any surface. In one embodiment, the mandrel 20 comprises silicon germanium and the conversion step in FIG. 3 can be omitted.

Figure 4:
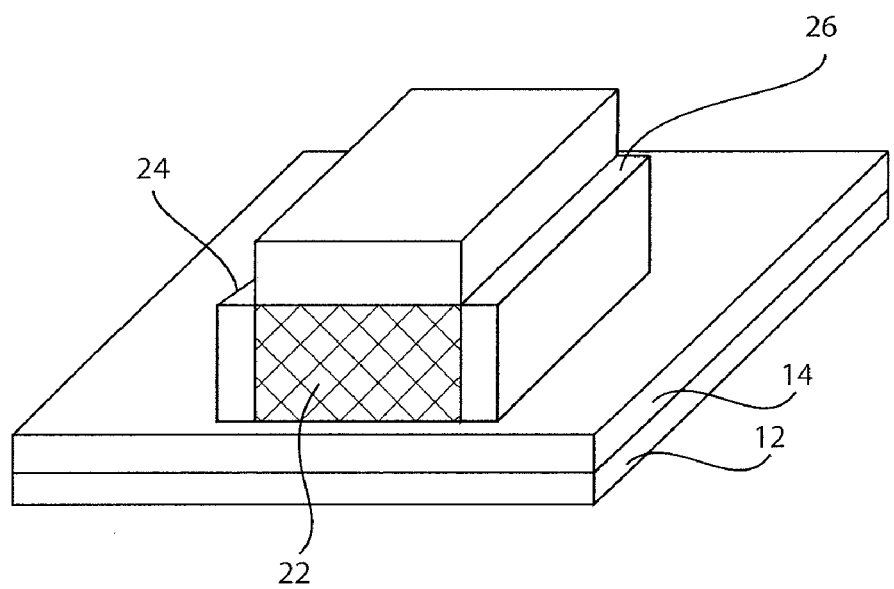
FIG. 4 is a perspective view of the device in FIG. 3 showing epitaxially grown semiconductor fins on sidewalls of the semiconductor layer.

Referring to FIG. 4, fins 24 and 26 are grown on sidewalls of material 22. In one embodiment, silicon fins 24 and 26 are grown epitaxially on sidewalls of porous silicon 22. The epitaxial silicon fins 24 and 26 can be undoped, or in-situ doped during epitaxial growth, or doped after epitaxial growth. For simplicity, the epitaxial silicon for fin 24 and 26 is undoped. In one embodiment, material 22 comprises silicon germanium and silicon fins 24 and 26 are grown epitaxially on sidewalls of silicon germanium 22.

Figure 5:
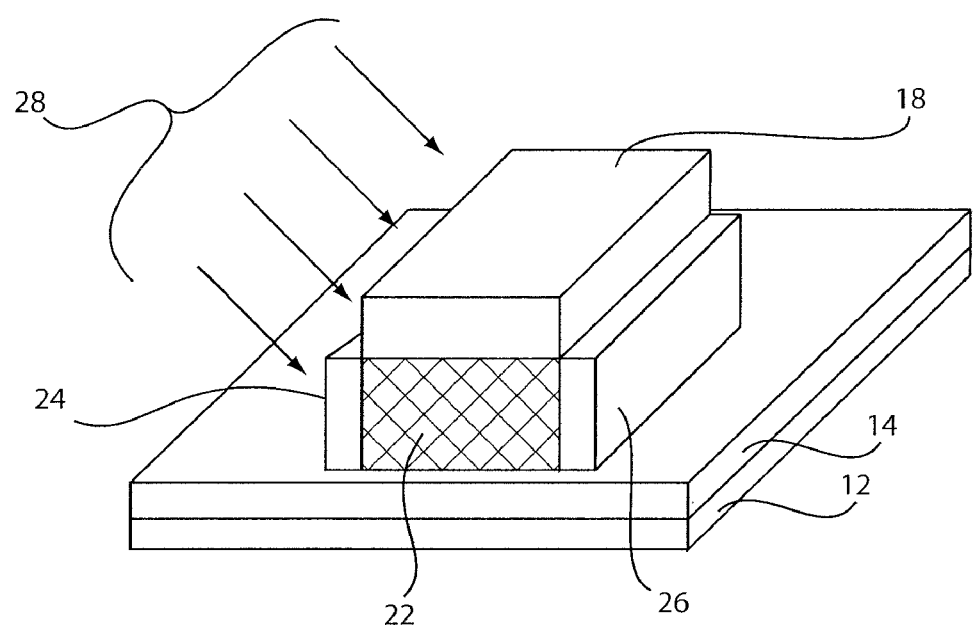
FIG. 5 is a perspective view of the device in FIG. 4 subjected to a first angled ion implantation of one of the fins on the sidewalls of the semiconductor layer.

Referring to FIG. 5, a first angled ion implantation 28 is performed to dope fin 24 on one side of material 22 (e.g., porous silicon). Angled ion implantation 28 includes bombarding the fin 24 with dopants, such as, phosphorus (P), arsenic (As), etc. for nFETs or boron (B), indium (In), antimony (Sb), etc. for pFETs. The density, time and energies may be varied to provide different threshold voltages for the resulting devices. Angles of implantation may be between approximately 5 degrees to about 75 degrees with respect to a vertical, normal to a major surface of the device. Other ion types, include but are not limited to, germanium (Ge), nitrogen (N), fluorine (F), carbon (C), sulfur (S), silicon (Si), etc. and other angles of attack may also be employed. Depending on fin thickness and implant species, the implant dose can range from $1\times10^{12}/cm^2$ to $5\times10^{15}/cm^2$, the implant energy can range from 0.5 KeV to 100 KeV. It should be noted that an angled implantation is employed to be able to select which portions of the fin 24 (or fin 26) are bombarded. Other surfaces may be exposed or protected from the bombardment to ensure that dopant density and type are appropriate to provide proper operation of the resulting devices.

It should be understood that the fins 24 and 26 may be formed of any width. In a particularly useful embodiment, fins 24 and 26 include a width that is of sub-minimum feature size. The epitaxial growth may be controlled to provide a width of any size but in particular a size less than the minimum feature size achievable by lithographic processing.

Figure 6:
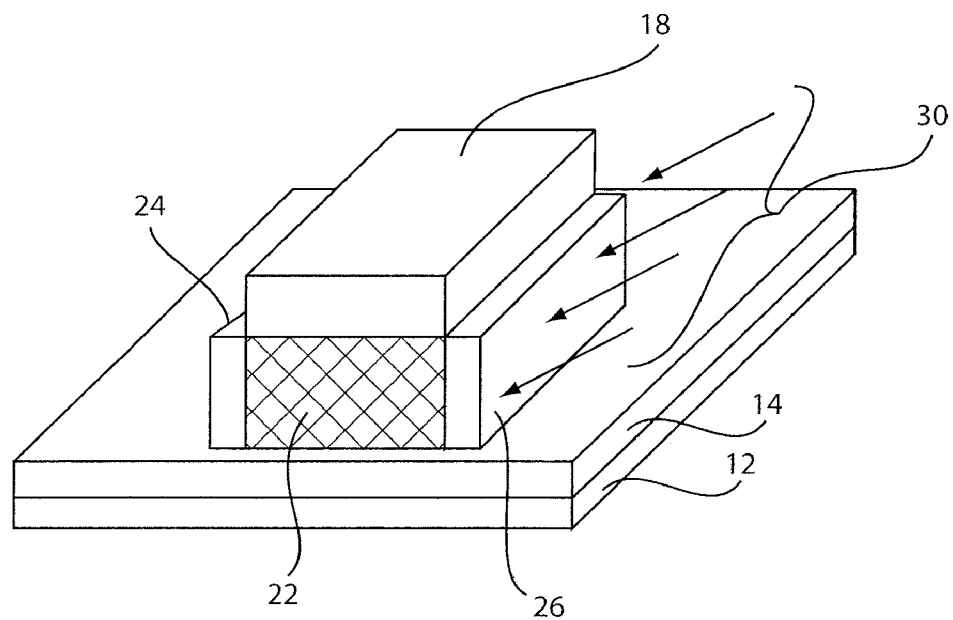
FIG. 6 is a perspective view of the device in FIG. 5 subjected to a second angled ion implantation of the other of the fins on the sidewalls of the semiconductor layer.

Referring to FIG. 6, a second angled ion implantation 30 is performed to dope fin 26 on the other side of material 22 (e.g., porous silicon). The second angled ion implantation can be skipped if no extra dopants are desired in fin 26. As mentioned, dopants may be included during the formation of fins 24 and/or 26.

Angled ion implantation 30 includes bombarding the fin 26 with dopants, such as, P, As, etc. for n-type dopants or B, etc. for p-type dopants. The density, time and energies may be varied to provide different threshold voltages for the resulting devices. Angles of implantation may be between approximately 5 degrees to about 75 degrees with respect to a vertical, normal to a major surface of the device. Other ion types, include but are not limited to, germanium (Ge), nitrogen (N), fluorine (F), carbon (C), sulfur (S), silicon (Si), etc. and other angles of attack may also be employed. Depending on fin thickness and implant species, the implant dose can range from $1\times10^{12}/cm^2$ to $5\times10^{15}/cm^2$, the implant energy can range from 0.5 KeV to 100 KeV. It should be noted that an angled implantation is employed to be able to select which portions of the fin 26 (or fin 24) are bombarded. Other surfaces may be exposed or protected from the bombardment to ensure that dopant density and type are properly employed to provide proper operation of the resulting devices.

It should be understood that the first and/or second ion implantation processes are advantageously performed without the formation of block masks or layers. In this way, many process steps are eliminated from a process of record even though two or more different doping steps are carried out.

Figure 7:
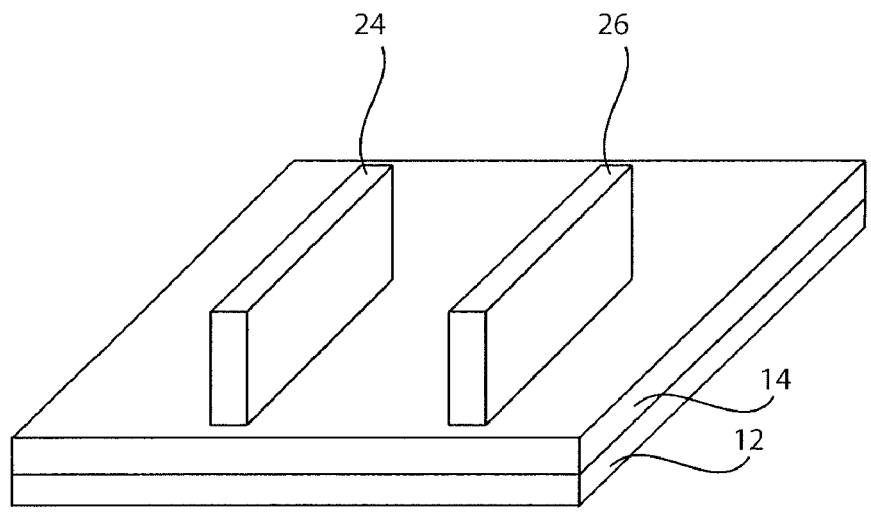
FIG. 7 is a perspective view of the device in FIG. 6 after the pad layer and the semiconductor layer have been removed.

Referring to FIG. 7, pad layer 18 and material 22 (e.g., porous silicon or silicon germanium) are removed. These may include one or more etching steps which are selective to the underlying layer (e.g., BOX layer 14) and fins 24 and 26. The resulting fins 24 and 26 can be further processed to form FETs. In this example, fin 24 and fin 26 are doped differently and may include with following illustrative combinations as set forth in Table 1.

TABLE 1

| Fin 24 | Fin 26 |
|---|---|
| n-type | p-type |
| doped | undoped |
| heavily doped (n or p) | lightly doped (n or p) |
| p-type | n-type |
| undoped | doped |
| lightly doped (n or p) | heavily doped (n or p) |

Figure 8:
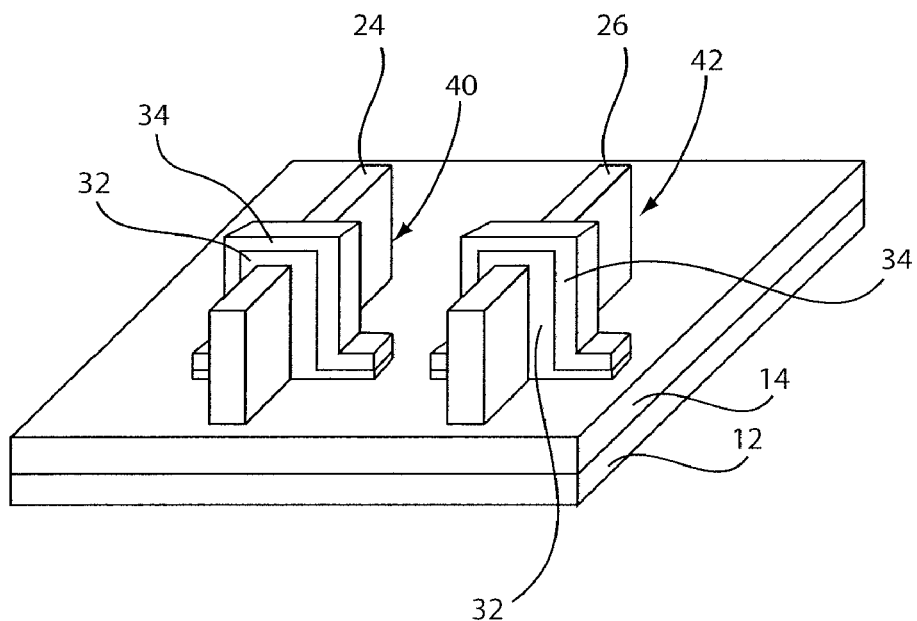
FIG. 8 is a perspective view of the device in FIG. 7 showing a small portion of a gate dielectric and a gate conductor to maintain the visibility of the underlying fins and to show the formation of finFETs.

Referring to FIG. 8, with different doping in two fins 24 and 26, different electrical properties are achieved. Since the fins 24 and 26 are formed together on a same layer 14 and have already been doped, further processing of the finFETs is facilitated. A single gate dielectric 32 deposition followed by a single gate conductor 34 deposition are performed over different types of fins and are patterned simultaneously along with other gate layers and side spacers to form transistors or other components. The subsequent processing advantageously can treat fins as though they were the same. In other words, since the materials and doping differences of fins 24 and 26 are considered and accounted for in advance during a maskless angled ion implantation, these structures can be further processed simultaneously. FinFETs 40 and 42 may be employed as a CMOS device or may include devices of a single polarity (NFETs or PFETs) having different threshold voltages, etc.

Other methods may be employed to provide a similar result in accordance with the present principles. For example, FIGS. 9-13 provide one such alternative approach.

Figure 9:
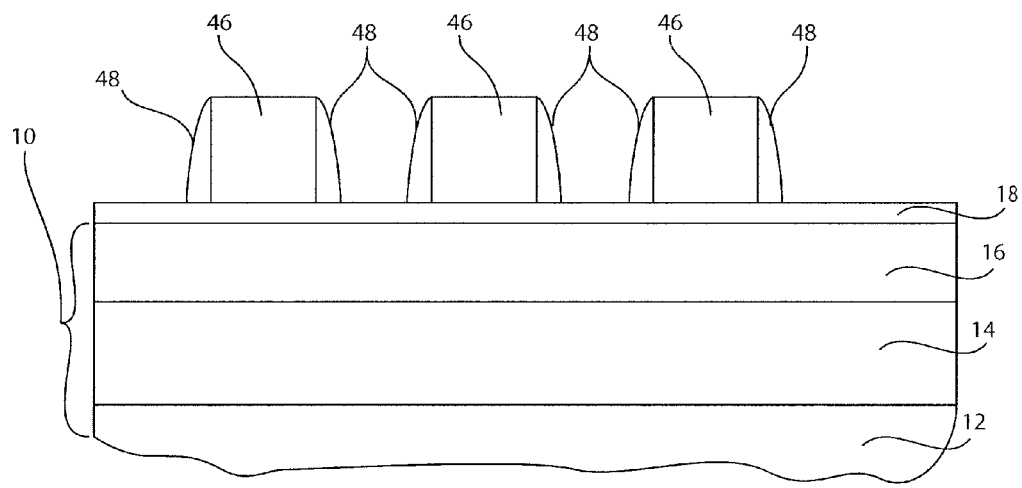
FIG. 9 is a cross-sectional view of a semiconductor-on-insulator substrate having a pad layer, mandrels and spacers formed thereon.

Referring to FIG. 9, a semiconductor-on-insulator substrate (SOI) 10 is shown having a pad layer 18 (e.g., oxide or nitride) and mandrels 46 formed thereon. The SOI substrate 10 may include a silicon base layer 12 with a buried oxide layer (BOX layer) 14 and a silicon on oxide layer 16. It should be understood that the substrate 10 may include any suitable material and is not limited to SOI. For example, substrate 10 may include gallium arsenide, monocrystalline silicon, germanium, bulk materials or any other material or combination of materials. In some embodiments, the substrate 10 further comprises other features or structures that are formed on or in the semiconductor substrate in previous process steps.

Mandrels 46 are formed on the layer 18 and patterned, preferably using a lithographic process that may include a resist layer (not shown) and lithographic patterning. Layer 18 may be formed by a deposition process and preferably include an oxide, such as silicon dioxide, or a form thereof. Mandrels 46 may be formed from an amorphous silicon or polycrystalline silicon (polysilicon) material. Spacers 48 are added around sidewalls of mandrels 46. The spacers 48 may include a silicon nitride material. The spacer material may be conformally deposited followed by an etch to remove spacer material from a surface of layer 18 and tops of mandrels 46. Other materials and process steps may also be employed to arrive at the structure depicted in FIG. 9.

Figure 10:
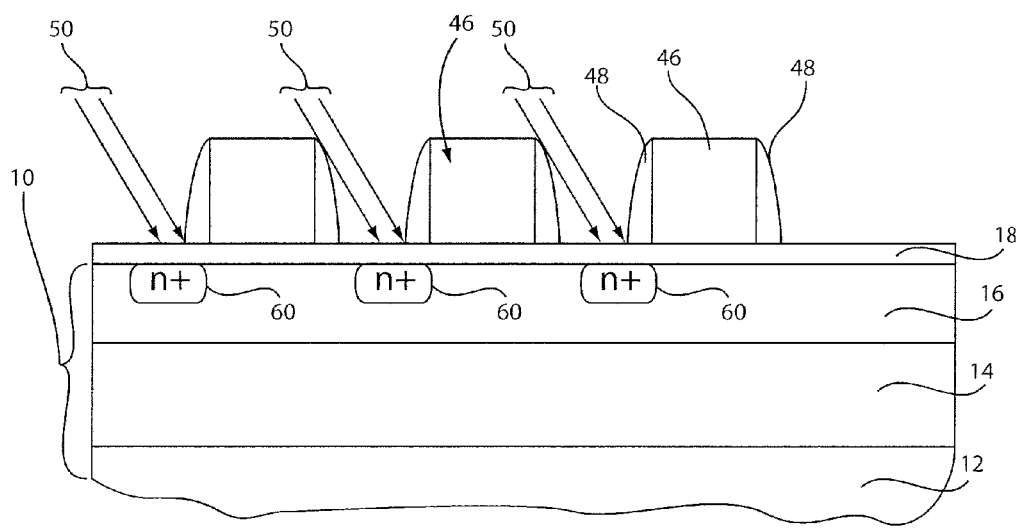
FIG. 10 is a cross-sectional view of the device in FIG. 9 subjected to a first angled ion implantation.

Referring to FIG. 10, a first angled ion implantation 50 includes bombarding the mandrels 46 and spacers 48 with dopants, such as, P, As, etc. for n-type dopants or B, etc. for p-type dopants. The dopants have energy sufficient to enter and remain within layer 16, which includes a semiconductor material, such as, e.g., silicon. The density, time and energies of the dopants may be varied to provide different threshold voltages for the resulting devices. Angles of implantation may be between approximately 5 degrees to about 75 degrees with respect to a vertical normal to a major surface of the device. Other ion types, include but are not limited to germanium (Ge), nitrogen (N), fluorine (F), carbon (C), sulfur (S), silicon (Si), etc. and other angles of attack may also be employed. Depending on fin thickness and implant species, the implant dose can range from $1\times10^{12}/cm^2$ to $5\times10^{15}/cm^2$, the implant energy can range from 0.5 KeV to 100 KeV. It should be noted that an angled implantation is employed to be able to select which portions of the layer 16 are bombarded between spacer/mandrel structure (48, 46). Other surfaces may be exposed or protected from the bombardment to ensure that dopant density and type are properly employed to provide proper operation of the resulting devices. In this illustration, doped regions 60 are formed using an n-type dopant. It should be understood that p-type dopants may have been employed instead.

Figure 11:
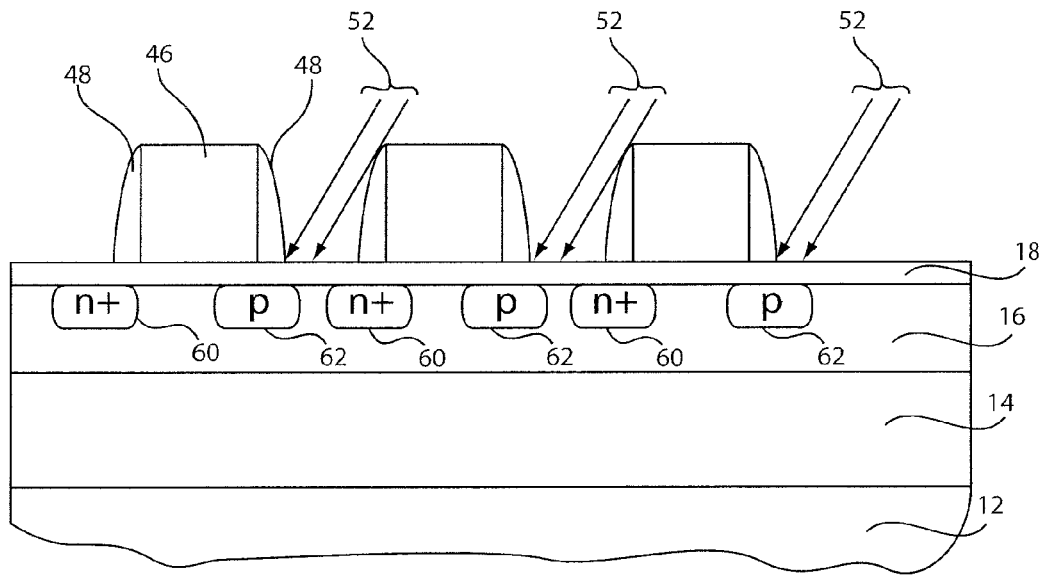
FIG. 11 is a cross-sectional view of the device in FIG. 10 subjected to a second angled ion implantation.

Referring to FIG. 11, a second angled ion implantation 52 includes bombarding the mandrels 46 and spacers 48 with dopants of opposite polarity from regions 60 or with a different dopant density to create different threshold voltage devices. The ions may include, e.g., P, As, etc. for n-type dopants or B, etc. for p-type dopants. In this illustration, if the first implantation includes n-type dopants, the second implantation includes p-type dopants (or vice versa). The dopants have energy sufficient to enter and remain within layer 16, which includes a semiconductor material, such as, e.g., silicon. The density, time and energies of the dopants may be varied to provide, e.g., different threshold voltages for the resulting devices. Angles of implantation may be between approximately 5 degrees to about 75 degrees with respect to a vertical normal to a major surface of the device. Other ion types, include but are not limited to, germanium (Ge), nitrogen (N), fluorine (F), carbon (C), sulfur (S), silicon (Si), etc. and other angles of attack may also be employed. Depending on the thickness of layer 18, desired depth in layer 16 and the implant species, the implant dose can range from $1\times10^{12}/cm^2$ to $5\times10^{15}/cm^2$ and the implant energy can range from 0.5 KeV to 100 KeV. It should be noted that an angled implantation is employed to be able to select which portions of the layer 16 are employed to form regions 62 between spacers 48 and mandrel structures 46.

Figure 12:
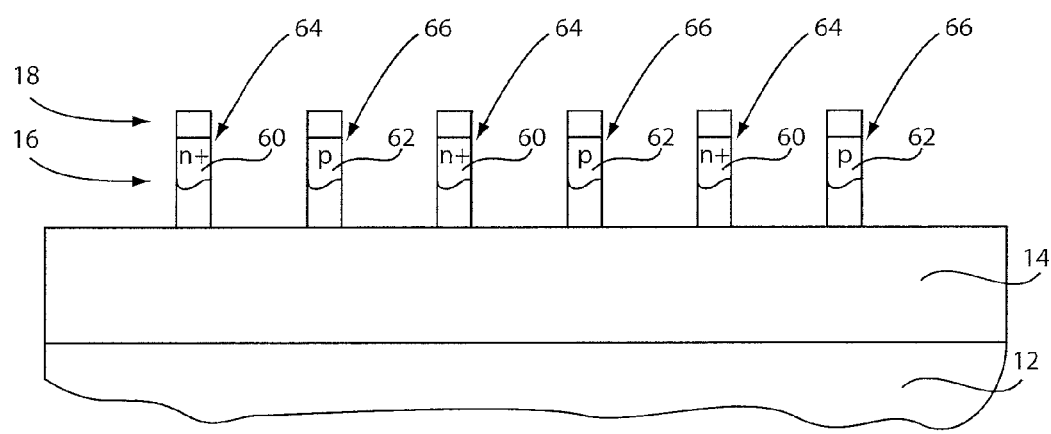
FIG. 12 is a cross-sectional view of the device in FIG. 11 after the mandrels have been removed and a semiconductor layer has been etched using the spacers as a mask.
Figure 13:
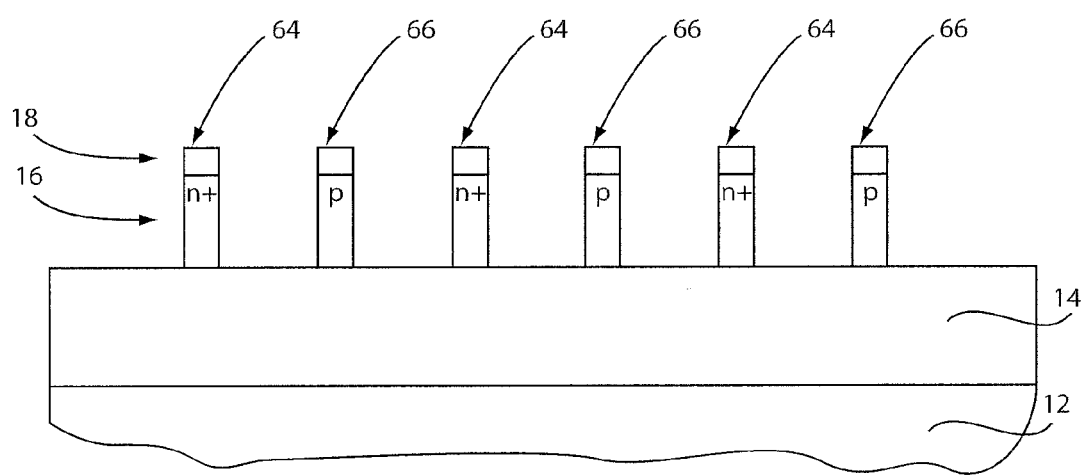
FIG. 13 is a cross-sectional view of the device in FIG. 12 after an anneal of the fins for the formation of finFETs.

Referring to FIG. 12, the mandrels 46 are removed by an etch process, followed by patterning and etching the pad layer 18 and, in this example, the silicon layer 16. The patterning and etching may be performed using the spacers 48 as a block mask to etch down to layer 14. Spacers 48 preferably include a sub-minimum feature size (e.g., a width less than that attainable by lithography). After etching layers 18 and 16, fins 64 and 66 are formed. Fins 64 and 66 include remaining portions of doped regions 60 and 62, respectively. Due to the angled implantations, doped regions of the fins 64 and 66 may not have a uniform concentration of dopants. In FIG. 13, an anneal process may be applied to diffuse dopants within the fins 64 and 66 to provide a more even distribution of dopants and to increase the size of active areas in the fins 64 and 66.

Processing can continue as before to complete the fabrication of finFETs and remaining portions of a chip or wafer.

Figure 14:
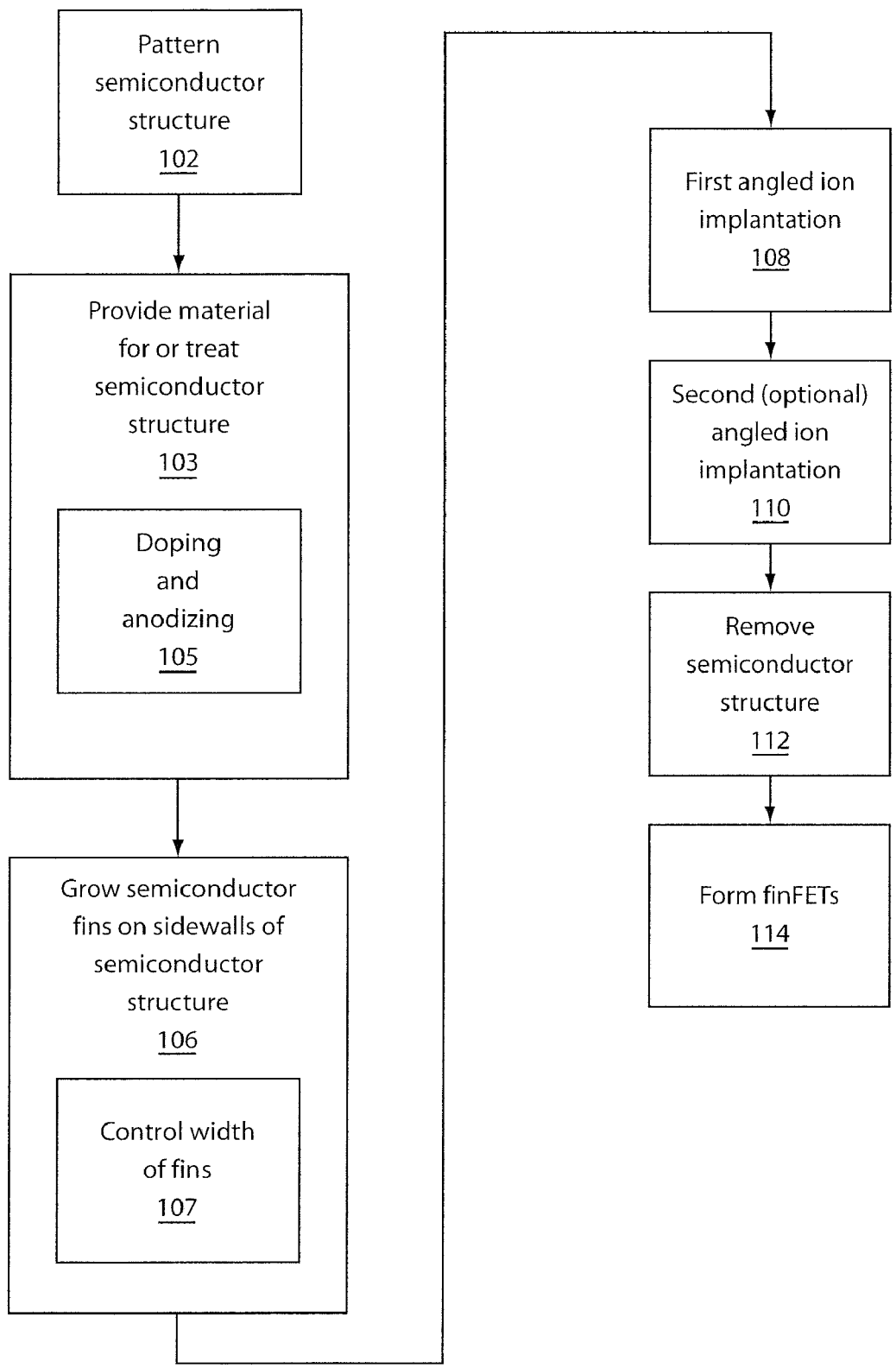
FIG. 14 is a block diagram showing an illustrative method for forming a semiconductor device with different field effect transistors on a same chip.

Referring to FIG. 14, a method for fabrication of features for an integrated circuit includes patterning a first semiconductor structure on a surface of a semiconductor substrate in block 102. The first semiconductor structure preferably includes a semiconductor material (silicon). In block 103, the first structure is treated to permit epitaxial growth on sidewalls of the first semiconductor structure. The treatment includes forming porous silicon by doping and anodizing in block 105. The first structure may include a material suitable for epitaxial growth (e.g., SiGe) so treatment may be avoided.

Semiconductor material is epitaxially grown on opposite sides of the first semiconductor structure to form fins in block 106. This may include epitaxially growing silicon on the porous silicon (or SiGe) of the first semiconductor structure. Dopants may be introduced during epitaxial growth of the semiconductor material. The epitaxial growth of the semiconductor material may be controlled to provide a width less than a minimum feature size achievable by a lithographic method in block 107.

In block 108, a first angled ion implantation is applied to one side of the first semiconductor structure to dope a respective fin on the one side. The other side remains in the shadow and therefore is not doped. In block 110, a second angled ion implantation is optionally applied to an opposite side of the first semiconductor structure to dope a respective fin on the opposite side. The first angled ion implantation may include doping the one side with a first polarity dopant, and the second angled ion implantation includes doping the opposite side with a second polarity dopant. In addition, the first angled ion implantation may include doping the one side with a first dopant density, and the second angled ion implantation may include doping the opposite side with a second dopant density. A combination of density and dopant types may also be employed for each implantation process.

In block 112, the first semiconductor structure is selectively removed to expose the fins. In block 114, fin field effect transistors are formed using the fins.

Figure 15:
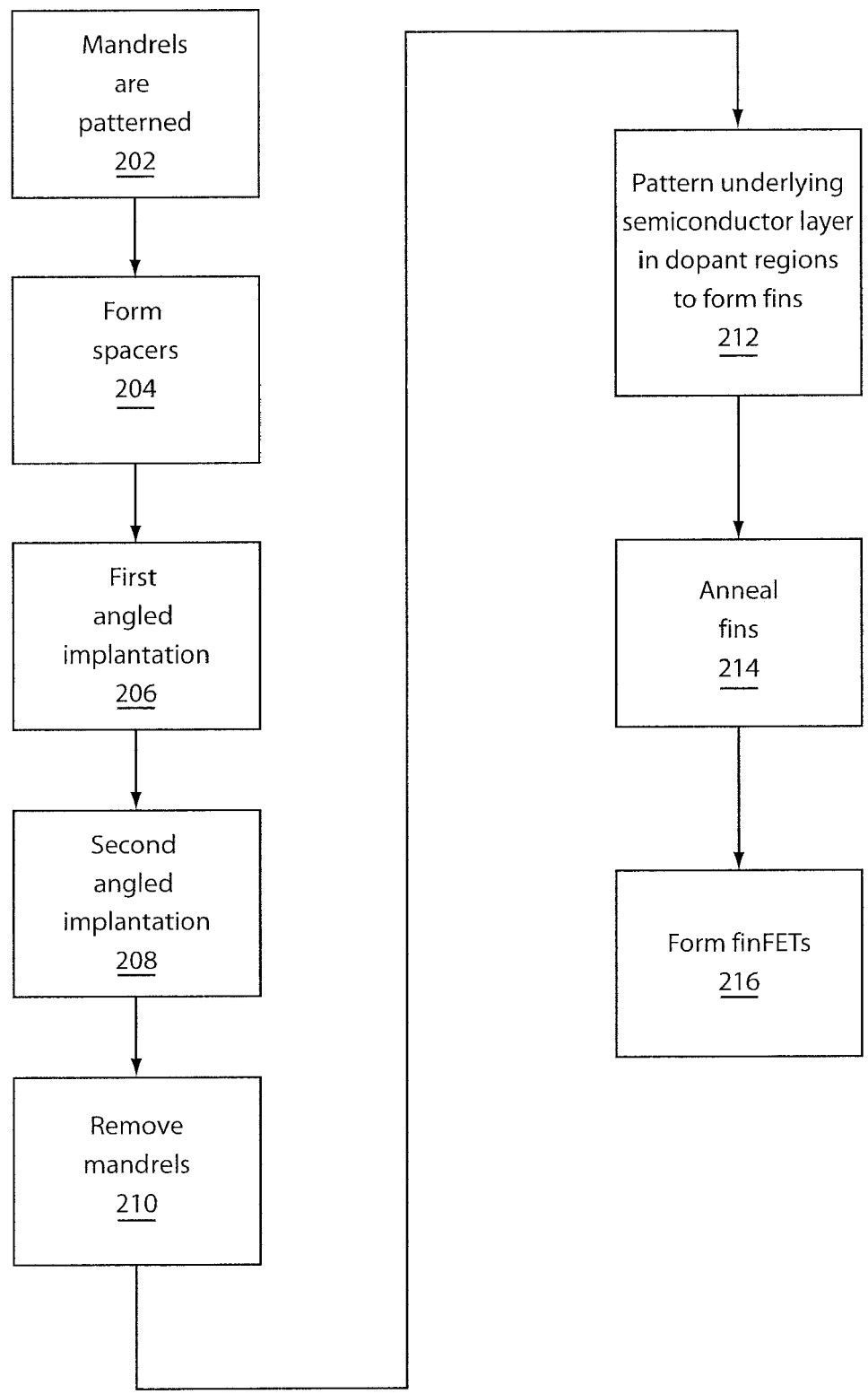
FIG. 15 is a block diagram showing another illustrative method for forming a semiconductor device with different field effect transistors on a same chip.

Referring to FIG. 15, another method for fabrication of features for an integrated circuit is illustratively shown. In block 202, mandrels are patterned on a surface of a semiconductor substrate. In block 204, spacers are formed about a periphery of the mandrels. The spacers preferably include a feature size less than a minimum feature size achievable by a lithographic method.

In block 206, a first angled ion implantation is applied to introduce a first doping such that the spacers and mandrels form a blocking mask to direct the first doping into an underlying semiconductor layer on one side of the blocking mask. In block 208, a second angled ion implantation is applied in an opposite direction to the first angled ion implantation to introduce a second doping such that the blocking mask directs the second doping into the underlying semiconductor layer on an opposite side of the blocking mask. The first doping may include a first polarity dopant, and the second doping may include a second polarity dopant and/or the first doping may include a first dopant density, and the second doping may include a second dopant density.

In block 210, the mandrels are selectively removed relative to the spacers. In block 212, the underlying semiconductor layer is patterned using the spacers as an etch mask to form fins with the first doping and fins with the second doping. In block 214, the fins with the first doping and fins with second doping are annealed to diffuse and distribute the dopants in the fins. In block 216, fin field effect transistors are formed using the fins. The fins preferably include a feature size less than a minimum feature size achievable by a lithographic method.

Having described preferred embodiments of method and structure for forming finFETs with multiple doping regions on a same chip (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabrication of features for an integrated circuit, comprising:
   patterning a first semiconductor structure on a surface of a semiconductor substrate;
   epitaxially growing semiconductor material on opposite sides of the first semiconductor structure to form a first fin and a second fin;
   applying a first angled ion implantation to one side of the first semiconductor structure to dope the first fin on the one side without doping the second fin;
   selectively removing the first semiconductor structure to expose the first fin and the second fin; and
   forming fin field effect transistors using the first fin and the second fin.

2. The method as recited in claim 1, further comprising treating the first structure to permit epitaxial growth on sidewalls of the first structure.

3. The method as recited in claim 1, further comprising applying a second angled ion implantation to an opposite side of the first semiconductor structure to dope the second without doping the first fin.

4. The method as recited in claim 1, wherein epitaxially growing semiconductor material includes introducing dopants during epitaxial growth of the semiconductor material.

5. The method as recited in claim 1, wherein epitaxially growing semiconductor material includes epitaxially growing the semiconductor material such that a width of the semiconductor material includes a size less than a minimum feature size achievable by a lithographic method.

6. The method as recited in claim 1, wherein the first semiconductor structure includes a material which permits direct epitaxial growth.

7. The method as recited in claim 1, wherein the first semiconductor structure includes silicon germanium.

8. The method as recited in claim 2, wherein the first semiconductor structure includes silicon and treating the first semiconductor structure includes forming porous silicon by doping and anodizing.

9. The method as recited in claim 8, wherein epitaxially growing semiconductor material includes epitaxially growing silicon on the porous silicon of the first semiconductor structure.

10. The method as recited in claim 3, wherein applying the first angled ion implantation includes doping the one side with a first polarity dopant and applying the second angled ion implantation includes doping the opposite side with a second polarity dopant.

11. The method as recited in claim 3, wherein applying the first angled ion implantation includes doping the one side with a first dopant density and applying the second angled ion implantation includes doping the opposite side with a second dopant density.

12. A method for fabrication of features for an integrated circuit, comprising:

patterning mandrels on a surface of a semiconductor substrate;

forming spacers about a periphery of the mandrels;

applying a first angled ion implantation to introduce a first doping such that the spacers and mandrels faun a blocking mask to direct the first doping into an underlying semiconductor layer on one side of the blocking mask;

applying a second angled ion implantation in an opposite direction to the first angled ion implantation to introduce a second doping such that the blocking mask directs the second doping into the underlying semiconductor layer on an opposite side of the blocking mask;

selectively removing the mandrels relative to the spacers;

patterning the underlying semiconductor layer using the spacers as an etch mask to form fins with the first doping and fins with second doping;

annealing the fins with the first doping and fins with second doping; and forming fin field effect transistors using the fins.

13. The method as recited in claim 12, wherein the first doping includes a first polarity dopant and the second doping includes a second polarity dopant.

14. The method as recited in claim 12, wherein the first doping includes a first dopant density and the second doping includes a second dopant density.

15. The method as recited in claim 12, wherein forming spacers includes forming spacers having a feature size less than a minimum feature size achievable by a lithographic method.

16. The method as recited in claim 12, wherein the fins have a feature size less than a minimum feature size achievable by a lithographic method.

* * * * *